United States Patent
Harada

(10) Patent No.: US 8,138,666 B2
(45) Date of Patent: Mar. 20, 2012

(54) WAVELENGTH CONVERSION MEMBER AND LIGHT-EMITTING DEVICE

(75) Inventor: Masamichi Harada, Kitakatsuragi-gun (JP)

(73) Assignee: Sharp Kabushiki Kaisha, Osaka-shi (JP)

(*) Notice: Subject to any disclaimer, the term of this patent is extended or adjusted under 35 U.S.C. 154(b) by 457 days.

(21) Appl. No.: 11/806,396

(22) Filed: May 31, 2007

(65) Prior Publication Data

US 2007/0278935 A1 Dec. 6, 2007

(30) Foreign Application Priority Data

Jun. 2, 2006 (JP) .................................. 2006-155098

(51) Int. Cl.
*H01L 27/14* (2006.01)
*H01L 27/15* (2006.01)

(52) U.S. Cl. ................... 313/503; 313/502; 313/498

(58) Field of Classification Search .......... 313/498–499, 313/500–504
See application file for complete search history.

(56) References Cited

U.S. PATENT DOCUMENTS

| | | | | |
|---|---|---|---|---|
| 4,902,929 | A | * 2/1990 | Toyoda et al. | 313/503 |
| 5,856,009 | A | * 1/1999 | Nishio et al. | 428/404 |
| 6,632,379 | B2 | * 10/2003 | Mitomo et al. | 252/301.4 R |
| 2005/0189863 | A1 | * 9/2005 | Nagatomi et al. | 313/486 |
| 2006/0001352 | A1 | * 1/2006 | Maruta et al. | 313/486 |
| 2006/0045832 | A1 | 3/2006 | Nagatomi et al. | |
| 2007/0085107 | A1 | 4/2007 | Nitta et al. | |

FOREIGN PATENT DOCUMENTS

| | | |
|---|---|---|
| JP | 10-65220 | 3/1998 |
| JP | 2002-17100 A | 6/2002 |
| JP | 2002-171000 A | 6/2002 |
| JP | 2002-188084 A | 7/2002 |
| JP | 2002-223008 A | 8/2002 |
| JP | 2002-314142 | 10/2002 |
| JP | 2002-363554 A | 12/2002 |
| JP | 2003-206481 A | 7/2003 |
| JP | 2004-071357 A | 3/2004 |
| JP | 2004-088008 A | 3/2004 |
| JP | 2004-161807 A | 6/2004 |
| JP | 2005-244075 | 9/2005 |
| JP | 2006-63233 | 3/2006 |
| JP | 2006-108509 | 4/2006 |
| WO | WO 2005071039 A1 * | 8/2005 |

OTHER PUBLICATIONS

Ohkubo, K. et al (1999) "Absolute Fluorescent Quantum Efficiency of NBS Phosphor Standard Samples," Journal of the Illuminating Engineering Institute of Japan 83(2):87-93 (partial translation).

* cited by examiner

*Primary Examiner* — Joseph L Williams
*Assistant Examiner* — Nathaniel Lee
(74) *Attorney, Agent, or Firm* — Morrison & Foerster LLP

(57) ABSTRACT

There are provided a wavelength conversion member including phosphors made of phosphor particles which are made of an oxynitride and/or a nitride and have a refractive index $n_1$, and a coating which coats each of the phosphor particles and has a refractive index $n_2$, and a medium having the phosphors dispersed therein and having a refractive index $n_3$, the refractive index $n_2$ of the coating being a value between $n_3$ and $n_1$, and a light-emitting device having the wavelength conversion member incorporated therein. It is preferable in the present invention that the coating is formed of a plurality of layers, and has its refractive index varying in a stepwise manner in a direction from a surface of each of the phosphor particles to an interface with the medium.

17 Claims, 2 Drawing Sheets

WAVELENGTH CONVERSION MEMBER AND LIGHT-EMITTING DEVICE

This nonprovisional application is based on Japanese Patent Application No. 2006-155098 filed with the Japan Patent Office on Jun. 2, 2006, the entire contents of which are hereby incorporated by reference.

BACKGROUND OF THE INVENTION

1. Field of the Invention

The present invention relates to a wavelength conversion member that contains phosphors made of phosphor particles each coated with a coating, and a light-emitting device having the phosphors and a semiconductor light-emitting element such as an LED or a semiconductor laser combined therein.

2. Description of the Background Art

A light-emitting device that converts light emitted from a semiconductor light-emitting element such as a light-emitting diode (LED), by means of phosphors, has a small size, and less power consumption than a light bulb. Accordingly, the light-emitting device has been put into practical use to serve as a light source for various types of display devices or illuminating devices. The light-emitting device is under development to achieve high efficiency or high reliability.

Japanese Patent Laying-Open No. 2002-171000 discloses a light-emitting device that emits white light by using a semiconductor light-emitting element emitting light having a wavelength of 390 nm to 420 nm, and phosphors excited by the light emitted from the semiconductor light-emitting element. As the phosphors made to emit light by the excitation light having a wavelength of 390 nm to 420 nm, there are used a variety of phosphors made of an oxide or a sulfide.

Unfortunately, however, some phosphors such as phosphors containing a sulfide may be reacted with moisture in the air and hydrolyzed. Such degradation of the phosphors would shorten a useful life of the light-emitting device. To deal with the problem, Japanese Patent Laying-Open No. 2002-223008 discloses phosphors each having a coating.

In recent years, instead of the oxide phosphors or sulfide phosphors, an example of oxynitride phosphors or nitride phosphors are disclosed in Japanese Patent Laying-Open No. 2002-363554 and Japanese Patent Laying-Open No. 2003-206481. Many of these phosphors have excellent properties such as capability of emitting light highly efficiently by being excited by the light having a wavelength of 390 nm to 420 nm, high stability, high water resistance, and less fluctuation in luminous efficacy, which fluctuations are caused by variations in operating temperature.

In order to further improve heat resistance of the nitride phosphors and others, Japanese Patent Laying-Open No. 2004-161807 discloses provision of a coating made of a metal nitride-based or metal oxynitride-based material. According to this document, when $(Sr_a, Ca_{1-a})_x Si_y O_z N_{\{(2/3)x+(4/3)y-(2/3)z\}}$ : Eu, x=2, y=5 is produced as the oxynitride phosphors, it is prone to baking degradation, and hence each of the phosphors is coated with a coating containing an N element. As the coating containing an N element, there are used a metal nitride-based material containing nitrogen and a metal such as aluminum, silicon, titanium, boron, or zirconium, and organic resin containing an N element, such as polyurethane or polyurea. According to this document, in nitrogen phosphors not provided with the coating containing an N element, luminous efficacy is drastically decreased when the phosphors are heated to 200-300° C., whereas in nitrogen phosphors provided with the coating containing an N element, decomposition of nitrogen is reduced owing to a supply of nitrogen, and hence heat resistance is improved.

Furthermore, Japanese Patent Laying-Open No. 2004-071357 discloses a light-emitting device in which phosphors are arranged such that a light-emitting element, red phosphors, green phosphors, and blue phosphors are arranged in this order, so that reabsorption of light emitted from the phosphors located on a side near the light-emitting element is suppressed.

SUMMARY OF THE INVENTION

As described above, the reason why a coating has conventionally been provided at each phosphor is to improve chemical stability and heat resistance of the phosphors. However, the coating is considered to exert an influence on incident efficiency of excitation light on the phosphors and extraction efficiency of fluorescence from the phosphors as well. Assume the case where a nitride coating is provided as in Japanese Patent Laying-Open No. 2004-161807. When a combination of the coating and oxynitride phosphors or nitride phosphors is considered, both of the phosphors and the coating are made of a nitride or a nitride-based material of the same type, and hence have similar refractive indices. When a large difference exists between a refractive index of the phosphors and a refractive index of a medium made of resin, glass, or the like for holding the phosphors in a dispersed state, sufficient effects cannot be obtained in terms of incident efficiency of excitation light on the phosphors and extraction efficiency of fluorescence from the phosphor particles.

An object of the present invention is to improve wavelength conversion efficiency of a wavelength conversion member by containing phosphors formed of phosphor particles made of an oxynitride or a nitride, each provided with an appropriate coating, while considering as well a medium such as resin or glass for coating a periphery of the phosphors. Another object of the present invention is to provide a light-emitting device having favorable luminous efficacy.

The present invention relates to a wavelength conversion member including: phosphors made of phosphor particles which are made of an oxynitride and/or a nitride and have a refractive index $n_1$, and a coating which coats each of the phosphor particles and has a refractive index $n_2$; and a medium having the phosphors dispersed therein and having a refractive index $n_3$, the refractive index $n_2$ of the coating being a value between $n_3$ and $n_1$.

Furthermore, it is preferable in the wavelength conversion member according to the present invention that the coating is formed of a plurality of layers, and has the refractive index $n_2$ varying in a stepwise manner in a direction from a surface of each of the phosphor particles to an interface with the medium.

Furthermore, it is preferable in the wavelength conversion member according to the present invention that the phosphor particles made of the oxynitride are phosphor particles each containing, as compositional elements, Si, Al, O, N, and at least one or two types of lanthanoid-based rare-earth elements.

Furthermore, it is preferable in the wavelength conversion member according to the present invention that the phosphor particles made of the nitride are phosphor particles each containing, as compositional elements, Ca, Si, Al, N, and at least one or two types of lanthanoid-based rare-earth elements.

Furthermore, it is preferable in the wavelength conversion member according to the present invention that the coating is made of a metal oxide.

Furthermore, it is preferable in the wavelength conversion member according to the present invention that the coating contains at least one of a magnesium oxide, an yttrium oxide, and an aluminum oxide.

Furthermore, it is preferable in the wavelength conversion member according to the present invention that the entire film thickness of the coating is not less than 5 nm and not more than 3 μm.

Furthermore, it is preferable in the wavelength conversion member according to the present invention that the coating is formed by a sol-gel method.

Furthermore, it is preferable in the wavelength conversion member according to the present invention that the medium is made of silicone resin.

Furthermore, it is preferable in the wavelength conversion member according to the present invention that the medium is made of glass.

Furthermore, the present invention relates to the wavelength conversion member in which the above-described medium has a first type of the phosphors having a fluorescence peak wavelength of not less than 400 nm and less than 500 nm, a second type of the phosphors having a fluorescence peak wavelength of not less than 500 nm and less than 600 nm, and a third type of the phosphors having a fluorescence peak wavelength of not less than 600 nm and not more than 700 nm dispersed therein.

Furthermore, the present invention relates to the wavelength conversion member including a first wavelength conversion member layer in which the phosphors having a fluorescence peak wavelength of not less than 400 nm and less than 500 nm are dispersed in the medium, a second wavelength conversion member layer in which the phosphors having a fluorescence peak wavelength of not less than 500 nm and less than 600 nm are dispersed in the medium, and a third wavelength conversion member layer in which the phosphors having a fluorescence peak wavelength of not less than 600 nm and not more than 700 nm are dispersed in the medium.

Furthermore, the present invention relates to a light-emitting device, including: a semiconductor light-emitting element; and the wavelength conversion member arranged to allow light emitted by the semiconductor light-emitting element to be incident thereon.

Furthermore, it is preferable in the light-emitting device according to the present invention that a third wavelength conversion member layer in which the phosphors having a fluorescence peak wavelength of not less than 600 nm and not more than 700 nm are dispersed in the medium, a second wavelength conversion member layer in which the phosphors having a fluorescence peak wavelength of not less than 500 nm and less than 600 nm are dispersed in the medium, and a first wavelength conversion member layer in which the phosphors having a fluorescence peak wavelength of not less than 400 nm and less than 500 nm are dispersed in the medium are arranged such that the light emitted by the semiconductor light-emitting element is made incident on the third, second, and first wavelength conversion member layers in this order.

Furthermore, it is preferable in the light-emitting device according to the present invention that a second wavelength conversion member layer in which the phosphors having a fluorescence peak wavelength of not less than 500 nm and less than 600 nm are dispersed in the medium, a third wavelength conversion member layer in which the phosphors having a fluorescence peak wavelength of not less than 600 nm and not more than 700 nm are dispersed in the medium, and a first wavelength conversion member layer in which the phosphors having a fluorescence peak wavelength of not less than 400 nm and less than 500 nm are dispersed in the medium are arranged such that the light emitted by the semiconductor light-emitting element is made incident on the second, third, and first wavelength conversion member layers in this order.

Furthermore, it is preferable in the light-emitting device according to the present invention that the semiconductor light-emitting element has an emission peak wavelength of not less than 370 nm and not more than 480 nm.

Furthermore, it is preferable in the light-emitting device according to the present invention that the semiconductor light-emitting element is a semiconductor light-emitting element made of a GaN-based semiconductor.

The wavelength conversion member according to the present invention achieves improvement in incident efficiency of excitation light on the phosphors and extraction efficiency of fluorescence from the phosphors, and hence achieves improvement in wavelength conversion efficiency when compared with the conventional one.

Furthermore, the present invention can provide a light-emitting device that achieves improvement in luminous efficacy, by combining the above-described wavelength conversion member and a semiconductor light-emitting element.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

<Basic Configuration of Wavelength Conversion Member>

A wavelength conversion member according to the present invention is the one in which phosphors are dispersed in a medium. The wavelength conversion member is preferably the one in which multiple phosphors are uniformly fixed in the medium. Each of the phosphors is made of a phosphor particle, which is made of an oxynitride and/or a nitride, coated with a coating. The coating may be a single-layer one or a multilayer one. In the following, a coating made of a single layer is referred to as a single-layer coating, while a coating made of multiple layers is referred to as a multilayer coating. Alternatively, the coating may also be provided by attaching fine particles made of a material of the coating to each of the phosphor particles. Note that at least a part of a surface of the phosphor particle may be coated with a coating.

Figure 2A:
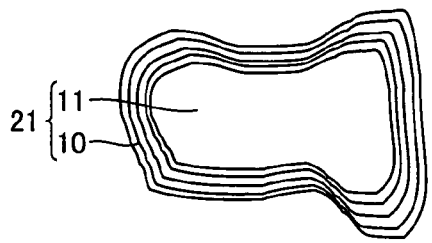
FIGS. 2A and 2B are cross-sectional views of a phosphor in the present invention.

A configuration of the form of the phosphor having a multilayer coating will be described based on FIGS. 2A and 2B. As shown in FIG. 2A, fine particles made of a material of the coating are successively attached to a blue phosphor particle 11 having an indefinite shape (which may be approximately spherical) to form multiple layers, which serve as a coating 10. A refractive index $n_2$ of the coating assumes a value between a refractive index $n_1$ of the phosphor particle and a refractive index $n_3$ of a medium, and varies in a stepwise manner from $n_1$ to $n_3$, from the layer located on a surface side of blue phosphor particle 11 to the layer located on a side of an interface with the medium.

Figure 2B:
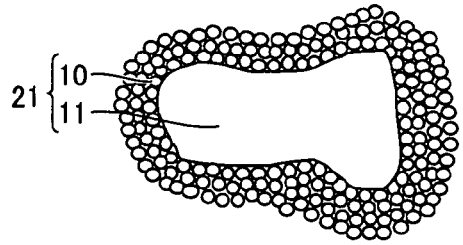

As shown in FIG. 2B, coating 10 may be formed such that the fine particles are attached with their shapes maintained to a certain extent. The blue phosphor particle in FIGS. 2A and 2B may also be replaced with a phosphor particle of any color such as red or green.

<Phosphor Particle>

The phosphor particle made of an oxynitride is preferably a phosphor particle containing, as compositional elements, Si, Al, O, N, and at least one or two types of lanthanoid-based rare-earth elements. A material system made of Si, Al, O, and N provides high wavelength conversion efficiency by having at least one or two types of lanthanoid-based rare-earths (La, Ce, Pr, Nd, Pm, Sm, Eu, Gd, Tb, Dy, Ho, Er, Tm, Yb) mixed therein, the lanthanoid-based rare earths serving as a luminescent center.

The phosphor particle having a nitride is preferably a phosphor particle containing, as compositional elements, Ca, Si, Al, N, and at least one or two types of lanthanoid-based rare-earth elements. A material system having Ca, Si, Al, and N provides high wavelength conversion efficiency by having at least one or two types of lanthanoid-based rare-earths (La, Ce, Pr, Nd, Pm, Sm, Eu, Gd, Tb, Dy, Ho, Er, Tm, Yb) mixed therein, the lanthanoid-based rare earths serving as a luminescent center.

It is particularly preferable that Ce-activated α sialon is used as a phosphor particle emitting blue light (blue phosphor particle), that Eu-activated β sialon is used as a phosphor particle emitting green light (green phosphor particle), and that Eu-activated $CaAlSiN_3$ is used as a phosphor particle emitting red light (red phosphor particle). Note that emission peak wavelengths of these phosphor particles are 660 nm, 540 nm, and 490 nm, respectively.

<Refractive Index of Coating>

In the present invention, it is possible to decrease the reflectance of a phosphor by considering a refractive index of its coating, and as a result, it is possible to increase wavelength conversion efficiency of the phosphor. The refractive index of the coating is required to assume a value between a refractive index of a phosphor particle and a refractive index of a medium. Furthermore, the coating is preferably made of a metal oxide. The metal oxide is generally transparent and stable, and hence is suitable for serving as a coating of an oxynitride phosphor particle or a nitride phosphor particle.

Accordingly, as to a phosphor particle such as Eu-activated β sialon, having a refractive index of approximately 2, for example, it is particularly preferable that a multilayer coating that coats the same is made of any of an yttrium oxide, a magnesium oxide, and an aluminum oxide, or made of a laminate of these oxides.

The yttrium oxide has a refractive index of approximately 1.87, for example, and hence by using the same to coat an oxynitride phosphor particle or a nitride phosphor particle, it is possible to decrease reflectance. Similarly, the magnesium oxide has a refractive index of approximately 1.74, for example, and hence by using the same to coat an oxynitride phosphor particle or a nitride phosphor particle, it is possible to decrease reflectance. Similarly, the aluminum oxide has a refractive index of approximately 1.63, for example, and hence by using the same to coat an oxynitride phosphor particle or a nitride phosphor particle, it is possible to decrease reflectance.

The coating is preferably formed by a sol-gel method. For a specific manipulation, phosphor particles and/or phosphors are initially injected into a sol made of a metal alkoxide derived from aluminum, yttrium, or magnesium. Then the sol attached to the phosphor particles and/or the phosphors is heated, with a catalyst added thereto, to cause a hydrolysis and polycondensation reaction to obtain a gel with no fluidity. The gel is heated as it is at approximately 30-50° C. After 1-5 hours, sediments are removed and heated to 100° C. to evaporate a solvent, and subsequently calcined in dry air at approximately 500° C. for a few tens of minutes. As such, phosphors each having a coating are fabricated.

There will be described a relation between a refractive index of each of a single-layer coating and a multilayer coating, and wavelength conversion efficiency of a phosphor. In order to describe the relation between a refractive index of a suitable coating and a reflectance of a phosphor, there is initially described a reflectance of a phosphor in the case of no coating. In the case where phosphor particles (refractive index=2.0) are dispersed in a medium (refractive index=1.4), a phosphor particle has a reflectance of 3.11% $(((2.0-1.4)/(2.0+1.4))^2)$ at its interface.

<Single-Layer Coating>

Figure 1:
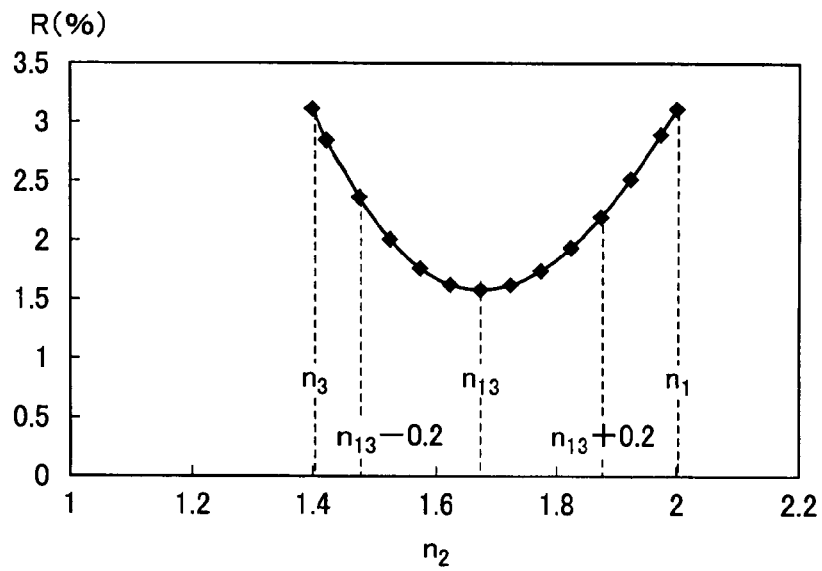
FIG. 1 is a drawing that shows a relation between a refractive index of a single-layer coating and a reflectance of phosphors in the present invention.

FIG. 1 is a graph in which the axis of abscissas represents a refractive index $n_2$ of a coating, while the axis of ordinates represents a reflectance R (calculated value) of a phosphor. Note that reflectance R in which light interferences are averaged is used as a reflectance in view of the fact that a film thickness of the coating and an incident angle of light on the coating are random. If refractive index $n_2$ of the coating is equal to refractive index $n_3$ of the medium, namely, 1.4, and if refractive index $n_2$ of the coating is equal to refractive index $n_1$ of the phosphor particle, namely, 2.0, the phosphor also exhibits a reflectance obtained in the case of no coating, in other words, a reflectance equal to that of the phosphor particle. If a refractive index of the coating is equal to a square root (refractive index: 1.67) of a product of a refractive index of the medium (1.4) and a refractive index of the phosphor particle (2.0), its reflectance assumes a local minimal value (1.58%). This refractive index is referred to as $n_{13}$. In that case, a reflectance of excitation light when the excitation light is made incident is decreased, so that incident efficiency of the excitation light is improved. At the same time, a reflectance of fluorescence when the fluorescence emerges is decreased, so that emergence efficiency of the fluorescence is improved. As a result, wavelength conversion efficiency is increased by approximately 3.1%.

<<Multilayer Coating>>

In the case of a multilayer coating, it is possible to vary the refractive index thereof in a stepwise manner in a direction from a surface of a phosphor particle to an interface with a medium by gradually varying refractive indices of the adjacent films that configure the multilayer coating.

For example, in the case where an oxynitride phosphor particle or a nitride phosphor particle is provided with a multilayer coating with the use of an yttrium oxide having a refractive index of approximately 1.87, a magnesium oxide having a refractive index of approximately 1.74, an aluminum oxide having a refractive index of approximately 1.63, and a silicon dioxide having a refractive index of approximately 1.5 to form a phosphor, there will be described a refractive index and a reflectance of the phosphor.

Assume that Eu-activated β sialon is used as a phosphor particle (refractive index: approximately 2.0). A reflectance at an interface between the phosphor particle and the yttrium oxide coating (refractive index: approximately 1.87) is 0.11%, a reflectance at an interface between the yttrium oxide coating (refractive index: approximately 1.87) and the magnesium oxide coating (refractive index: approximately 1.74) is 0.13%, a reflectance at an interface between the magnesium oxide coating (refractive index: approximately 1.74) and the aluminum oxide coating (refractive index: approximately 1.63) is 0.11%, a reflectance at an interface between the aluminum oxide coating (refractive index: approximately 1.63) and the silicon dioxide coating (refractive index: approximately 1.5) is 0.17%, and a reflectance at an interface between the silicon dioxide coating (refractive index: approximately 1.5) and the medium (the phosphor) is 0.12%. Accordingly, the reflectance in total is 0.64%, which is lower than a reflectance of 3.1% of the phosphor particle by approximately 2.5%. It is therefore possible to estimate that wavelength conversion efficiency is increased by approximately 5.0%, in combination with incident efficiency of excitation light and emergence efficiency of fluorescence.

As such, by stacking multiple coatings each having a suitable refractive index, a reflectance of the phosphor is further decreased than in the case of the single-layer coating, and incident efficiency of excitation light and emergence efficiency of fluorescence are further improved than in the case of the single-layer coating. Consequently, wavelength conversion efficiency is improved (wavelength conversion efficiency is improved by 1.9% when compared with the case of the single-layer coating.).

<Film Thickness of Coating>

For a film thickness of the coating, a film thickness approximately equal to $$(\lambda/n_2) \times (1/4 + M/2)$$

(where $\lambda$ is a wavelength of light, and M is an integer.) at which an interference effect becomes maximal, is particularly suitable. For example, in the case where refractive index $n_2$ of the coating is $n_{13}$ in FIG. 1 (refractive index: 1.67), where a wavelength $\lambda$ is 405 nm, which corresponds to a wavelength of excitation light in the embodiment, and where M is zero, a film thickness of the coating that provides a maximal interference effect is 61 nm. The interference effect has a cosine relation with a film thickness, and hence if the film thickness assumes not less than approximately one-fourth of this value (e.g. 15 nm), a reflectance reduction effect due to interference is produced. It is considered that, if the film thickness assumes not less than approximately one-half, and not more than approximately one and a half, of the relevant value (61 nm) (e.g. not less than 30 nm and not more than 90 nm), a sufficient reflectance reduction effect is considered to be produced.

Basically, the same applies to the case where M is an integer equal to or larger than 1. However, if the film thickness is large, variations in film thickness distribution and variations in incident angle of light are averaged. Accordingly, an amplitude of the reflectance, which takes a cosine shape in a film thickness-versus-reflectance graph, is gradually attenuated, and hence an approximately constant interference effect is considered to be produced at a film thickness equal to or larger than a certain level. Note that the above-described discussion also holds true for fluorescence, by using a fluorescence wavelength value as wavelength $\lambda$.

By forming a coating, it may be possible to obtain an additional effect as follows, along with increase in wavelength conversion efficiency. By forming a coating, it is possible to reduce a surface state, which contributes to a nonradiative process at a surface of the phosphor (an electron in an excited state is brought into a non-excited state, not by a transition accompanied with light emission, but by a nonradiative transition through the surface state). Furthermore, with a surface modification effect, it is possible to favorably disperse phosphors in a medium made of resin, glass, or the like, while preventing agglomeration thereof. Furthermore, by forming a coating, the coating serves as a protective film of a phosphor particle, so that the phosphor is excellent in prolonged stability in luminous efficacy and chromaticity. Increase in wavelength conversion efficiency is experimentally recognized at a film thickness of not less than 5 nm and not more than 3 µm, and it can be interpreted that the coating has an additional effect along with an interference effect.

<Medium>

In the present invention, the medium is preferably made of silicone resin or glass. The silicone resin has a siloxane bond (Si—O) as a skeleton, and hence it is less likely to be degraded by blue to near-ultraviolet light used as excitation light for a phosphor. Accordingly, it is suitable as a medium for the wavelength conversion member.

<Configuration of Wavelength Conversion Member>

A configuration of the wavelength conversion member according to the present invention is the one in which first phosphors having a fluorescence peak wavelength of not less than 400 nm and less than 500 nm, second phosphors having a fluorescence peak wavelength of not less than 500 nm and less than 600 nm, and third phosphors having a fluorescence peak wavelength of not less than 600 nm and not more than 700 nm are dispersed in the medium. At this time, the first, second, and third phosphors emit blue light, green light, and red light, respectively. Accordingly, the first, second, and third phosphors may also be referred to as blue phosphors, green phosphors, and red phosphors, respectively, in the following. A coating of each of the first phosphors, a coating of each of the second phosphors, and a coating of each of the third phosphors may be made of the same or different materials. By adopting this configuration, it is possible to obtain a characteristic capable of emitting white light.

Furthermore, the present invention may be a wavelength conversion member including a first wavelength conversion member layer in which the phosphors according to the present invention having a fluorescence peak wavelength of not less than 400 nm and less than 500 nm are dispersed in the medium, a second wavelength conversion member layer in which the phosphors according to the present invention having a fluorescence peak wavelength of not less than 500 nm and less than 600 nm are dispersed in the medium, and a third wavelength conversion member layer in which the phosphors according to the present invention having a fluorescence peak wavelength of not less than 600 nm and not more than 700 nm are dispersed in the medium. At this time, the first wavelength conversion member layer is a blue phosphor layer, the second wavelength conversion member layer is a green phosphor layer, and the third wavelength conversion member layer is a red phosphor layer. The following is based on the concept that the phosphor layer includes a blue phosphor layer, a green phosphor layer, and a red phosphor layer. Coatings of the phosphors in the first, second, and third wavelength conversion member layers may be made of the same or different materials.

<Method of Producing Wavelength Conversion Member>

A method of producing a wavelength conversion member will now be described based on the wavelength conversion member described in FIG. 4, which shows an example of the light-emitting device. Initially, blue phosphors 21, green phosphors 22, and red phosphors 23 are added to silicone resin, glass, or the like in a liquid state, which is to serve as a medium 24, and uniformly mixed. At this time, "a weight of the phosphors/a weight of medium 24" is set to be approximately 0.01-0.3, and the three types of phosphors are mixed such that white light is emitted. When the phosphors are uniformly mixed, the medium is formed into a sheet having a thickness of 0.5-1.5 mm and heated at 100-150° C. for 30-90 minutes to be cured, so that a wavelength conversion member 69 is fabricated.

A refractive index of a coating having a multilayer structure varies in a stepwise manner between a refractive index of medium 24 and a refractive index of a phosphor particle in each of the phosphors of three types in wavelength conversion member 69. Accordingly, incident efficiency of excitation light on the phosphors is increased, which makes it possible to improve extraction efficiency of fluorescence from each of the phosphors. By blending three types of phosphors, there is formed wavelength conversion member 69 capable of emitting approximately white light.

A method of producing a wavelength conversion member will hereinafter be described based on FIG. 5, which shows another example of the wavelength conversion member. Initially, red phosphors are uniformly mixed in a silicone resin raw material or the like in a liquid state. The raw material is then formed into a sheet having a thickness of 0.2-0.5 mm and heated at 100-150° C. for 30-90 minutes for resin curing, so that a red phosphor layer 73 is fabricated. Next, as to a green phosphor layer 72, green phosphors are uniformly mixed in a silicone resin raw material or the like in a liquid state. The raw material is then poured onto red phosphor layer 73, and the resin is similarly cured. Furthermore, as to a blue phosphor layer 71, blue phosphors are uniformly mixed in a silicone resin raw material or the like. The raw material is then poured onto green phosphor layer 72, and the resin is similarly cured. As such, there is formed a phosphor layer made of three layers (wavelength conversion member), which also serves as a sealant of the light-emitting element. At this time, "a weight of the phosphors in each of the phosphor layers/a weight of each of the phosphor layers" is preferably set to be approximately 0.01-0.3. Note that the red phosphor layer and the green phosphor layer may be interchanged.

By adopting this configuration, it is possible to reduce light absorption by each of the phosphor layers, allow efficient emission of visible light, and obtain a characteristic capable of emitting white light.

<Light-Emitting Device>

The present invention is a light-emitting device in which a semiconductor light-emitting element and the above-described wavelength conversion member are arranged such that light emitted by the semiconductor light-emitting element is made incident thereon. It is thereby possible to obtain a light-emitting device excellent in wavelength conversion efficiency.

Initially, a structure of the light-emitting device will be described based on FIG. 4, which shows an example of the light-emitting device of the present invention.

A light-emitting device 60 is made of a base body 65, electrodes 66, 67 formed at a surface of the base body, a semiconductor light-emitting element 64 electrically connected to electrodes 66, 67, a mirror 68, and wavelength conversion member 69 sealing semiconductor light-emitting element 64 and converting light emitted from semiconductor light-emitting element 64 into fluorescence. Wavelength conversion member 69 is formed of medium 24 made of silicone resin or the like, and blue phosphors 21, green phosphors 22, and red phosphors 23 dispersed in medium 24.

By blending three types of phosphors, it is possible to obtain light-emitting device 60 that glows approximately white. Furthermore, light of three primary colors can be emitted, and each of the phosphors has an emission spectrum with a large half-width. Accordingly, favorable color rendering properties are obtained.

As such, by using the wavelength conversion member according to the present invention and the semiconductor light-emitting element made of a GaN-based semiconductor, it is possible to obtain a highly-efficient, small-sized, light-emitting device capable of providing approximately white light.

A structure of the light-emitting device will now be described based on FIG. 5, which shows another example of the light-emitting device of the present invention.

A light-emitting device 70 is made of a base body 75, electrodes 76, 77 formed at a surface of the base body, a semiconductor light-emitting element 74 electrically connected to electrodes 76, 77, a mirror 78, red phosphor layer 73, green phosphor layer 72, and blue phosphor layer 71. Each of the phosphor layers serves as a wavelength conversion member.

Red phosphor layer 73, green phosphor layer 72, blue phosphor layer 71 are stacked in this order from a side near semiconductor light-emitting element 74, and they convert excitation light emitted by semiconductor light-emitting element 74 into light of respective colors.

By stacking the phosphor layers in this order to form a wavelength conversion member, light emitted at red phosphor layer 73 is less likely to be absorbed by green phosphor layer 72 and blue phosphor layer 71 located thereabove, and light emitted at green phosphor layer 72 is less likely to be absorbed by blue phosphor layer 71. This is attributed to the fact that a phosphor generally has a lower light absorption rate in a range of a wavelength larger than that of fluorescence emitted by itself, when compared with a light absorption rate in a wavelength of the fluorescence (see Patent Document 6). Accordingly, by reducing light absorption by each of the phosphor layers, it is possible to emit visible light efficiently.

In the case of the phosphors according to the present invention, less light is reflected at each of their surfaces, and as a result, reabsorption of fluorescence is increased. Accordingly, such phosphors receive a greater advantage of reducing reabsorption of fluorescence by means of such an arrangement. The phosphors have an oxynitride phosphor particle and/or a nitride phosphor particle. With this, light of three primary colors can be emitted, and each of the phosphors has an emission spectrum with a large half-width of not less than 50 nm, for example, so that favorable color rendering properties are obtained.

A structure of the light-emitting device will now be described based on FIG. 6, which shows still another example of the light-emitting device of the present invention.

A light-emitting device 80 is made of a base body 85, electrodes 86, 87 formed at a surface of the base body, a semiconductor light-emitting element 84 electrically connected to the electrodes, a mirror 88, a green phosphor layer 82, a red phosphor layer 83, and a blue phosphor layer 81. With this arrangement, blue phosphor layer 81, which has a low luminosity factor and also has luminous efficacy somewhat lower than those of other colors, is arranged at a position apart from semiconductor light-emitting element 84, and hence it is possible to suppress reabsorption of blue fluorescence at green phosphor layer 82 and red phosphor layer 83.

In other words, by allowing blue phosphor layer 81, which absorbs much excitation light, to be an uppermost layer, green light and red light can efficiently be extracted, so that it is possible to obtain a white light-emitting device excellent in wavelength conversion efficiency as a whole. With these, light of three primary colors can be emitted, and each of the phosphors has an emission spectrum with a large half-width of not less than 50 nm, for example, so that favorable color rendering properties are obtained.

As a light source, it is possible to use a violet to near-violet light (wavelength: not more than 420 nm) or a blue light source (emission peak wavelength: not less than 420 nm and not more than 480 nm, e.g. approximately 460 nm). When the blue light source is used, it is possible to obtain blue-light emission and white-light emission without using blue phosphors. At the present time, the blue phosphors are somewhat inferior in efficiency to that of other phosphors. Accordingly, by obtaining blue light from an LED, the entire luminous efficacy can be increased.

When an element made of a GaN-based semiconductor is used as the semiconductor light-emitting element, the one having favorable electro-optic conversion efficiency and having an emission peak wavelength of not less than 390 nm and not more than 420 nm is particularly preferable. For the semiconductor light-emitting element, it may also be possible to use a semiconductor light-emitting element made of an organic semiconductor, a zinc oxide semiconductor, or the like, in addition to the semiconductor light-emitting element made of a GaN-based semiconductor. A semiconductor laser may be used in addition to the LED.

In Examples below, the following method of measurement was used.

Emission peak wavelength, full width at half maximum of emission spectrum, and excitation spectrum Using an integrating sphere, total luminous flux emission spectrum and optical absorption spectrum of phosphor were measured (Reference: Kazuaki OHKUBO et. al., "Absolute Fluorescent Quantum Efficiency of NBS Phosphor Standard Samples," Journal of the Illuminating Engineering Institute of Japan, Vol. 83, No. 2, 1999, pp. 87-93). For the measurement, spectrophotometer type F4500 (manufactured by HITACHI) was used. The optical absorption was calculated by first calculating reflectance of phosphor pressed onto a cell of 2 mm in thickness using the integrating sphere, and then by subtracting the calculated reflectance from 1.

Phosphor Chromaticity Variation

Using spectral measurement apparatus MCPD7000 (manufactured by Otsuka Electronics Co. Ltd.), chromaticity coordinates were measured.

Example 1

Wavelength Conversion Member

As shown in FIG. 2A, coating 10 was initially formed by successively attaching fine particles of yttrium oxide (refractive index: 1.87), fine particles of magnesium oxide (refractive index: 1.74), fine particles of aluminum oxide (refractive index: 1.63), and fine particles of silicon dioxide (refractive index: 1.5) to blue phosphor particle 11 having a indefinite shape and made of Ce-activated α sialon (compositional formula: $Ca_{0.25}Ce_{0.25}(Si,Al)_{12}(O,N)_{16}$, refractive index: 2.0) by a sol-gel method, so that blue phosphor 21 was fabricated. A thickness of each of the layers made of the fine particles was 30-90 nm, and a thickness of the multilayer coating was 0.3 μm.

Figure 3:
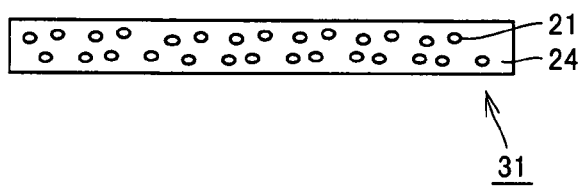
FIG. 3 is a cross-sectional view of a wavelength conversion member identified as an example of the present invention.

Next, a wavelength conversion member 31 shown in FIG. 3 was fabricated as follows. Blue phosphors 21 were added to a silicone resin raw material in a liquid state and uniformly mixed. The material was then formed into a sheet having a thickness of 0.5 mm, heated at 120° C. for 60 minutes, and cured to fabricate wavelength conversion member 31. Silicone resin 24 serving as a medium of wavelength conversion member 31 had a refractive index of 1.4, blue phosphor particles 11 had a refractive index of approximately 2.0, and coating 10 had a refractive index varying therebetween in a stepwise manner. It was therefore possible to improve incident efficiency of excitation light on blue phosphors 21 and extraction efficiency of fluorescence from blue phosphors 21.

Furthermore, a surface modification effect was also obtained by provision of the coating, so that blue phosphors 21 could favorably be dispersed in the medium made of resin, glass, or the like, without allowing them to agglomerate. This seemed to be attributable to an advantage that a coating made of a magnesium oxide particularly has a strong tendency to be charged positively, so that blue phosphors 21 repel one another by static electricity and are less likely to agglomerate.

Example 2

Light-Emitting Device

Figure 4:
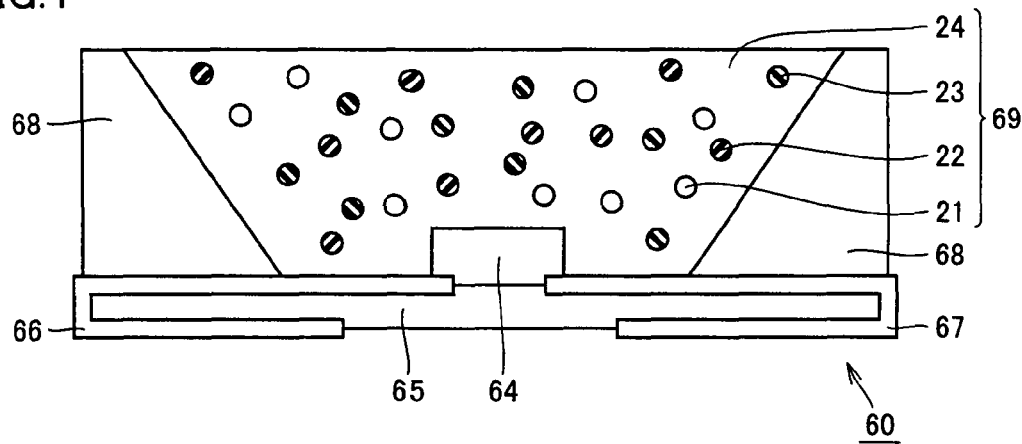
FIG. 4 is a cross-sectional view of a light-emitting device identified as an example of the present invention.

In FIG. 4, light-emitting device 60 was fabricated of base body 65, electrodes 66, 67 formed at the surface of the base body, semiconductor light-emitting element 64 electrically connected to electrodes 66, 67, mirror 68, and wavelength conversion member 69 sealing semiconductor light-emitting element 64 and converting light emitted from semiconductor light-emitting element 64 into fluorescence. Assume that wavelength conversion member 69 was made of silicone resin (refractive index: 1.4) that was to serve as medium 24, and blue phosphors 21, green phosphors 22, and red phosphors 23 dispersed in medium 24. Here, as to blue phosphors 21, green phosphors 22, and red phosphors 23, there were used blue phosphor particles made of Ce-activated α sialon, green phosphor particles made of Eu-activated β sialon, and red phosphor particles made of Eu-activated $CaAlSiN_3$, respectively, each phosphor particles having a coating formed thereat by a method similar to that of blue phosphor 21 formed in Example 1.

As semiconductor light-emitting element 64, there was used an LED made of a GaN-based semiconductor having an emission peak wavelength of 405 nm (a semiconductor containing at least Ga and N, in which Al, In, an n-type dopant, a p-type dopant, and others were used as needed).

Blue phosphors 21, green phosphors 22, and red phosphors 23 had emission peak wavelengths of 490 nm, 540 nm, and 660 nm, respectively.

Wavelength conversion member 69 was fabricated as follows. Three types of phosphors were added to a silicone resin raw material in a liquid state, uniformly mixed, and then poured on base body 65. The raw material was cured through heating at 120° C. for 60 minutes. Medium 24 in wavelength conversion member 69 had a refractive index of 1.4, each of the phosphors had a refractive index of approximately 2.0, and the stacked coatings had a refractive index varying therebetween in a stepwise manner, so that it was possible to improve incident efficiency of excitation light on the phosphors and extraction efficiency of fluorescence from the phosphors. By blending three types of the phosphors, there was obtained light-emitting device 60 glowing in an approximately white color at chromaticity coordinates of x=0.32 and y=0.35. Furthermore, light of three primary colors could be emitted, and each of the phosphors had an emission spectrum with a large half-width of not less than 50 nm, for example, so that favorable color rendering properties were obtained.

As such, by using the wavelength conversion member where oxynitride phosphor particles or nitride phosphor particles each having a coating were dispersed, and the semiconductor light-emitting element made of a GaN-based semiconductor, there was obtained a highly-efficient, small-sized, light-emitting device capable of providing approximately white light.

Example 3

Light-Emitting Device

Figure 5:
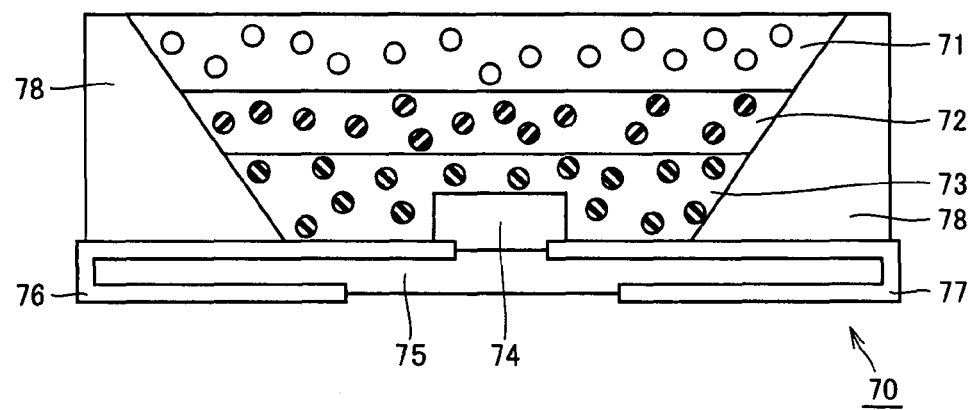
FIG. 5 is a cross-sectional view of a light-emitting device identified as another example of the present invention.

In FIG. 5, light-emitting device 70 was fabricated of base body 75, electrodes 76, 77 formed at a surface of the base body, semiconductor light-emitting element 74 electrically connected to electrodes 76, 77, mirror 78, red phosphor layer 73, green phosphor layer 72, and blue phosphor layer 71. Note that a laminate of three types of the phosphor layers was referred to as a wavelength conversion member.

For semiconductor light-emitting element 74, there was used an LED made of a GaN-based semiconductor having an emission peak wavelength of 405 nm.

Red phosphor layer 73, green phosphor layer 72, and blue phosphor layer 71 were stacked in this order from a side near semiconductor light-emitting element 74.

For the blue phosphors dispersed in blue phosphor layer 71, there were used phosphor particles made of Ce-activated a sialon and each provided with a coating made of a magnesium oxide. For the green phosphors dispersed in green phosphor layer 72, there were used phosphor particles made of Eu-activated β sialon and each provided with a coating made of a magnesium oxide. For the red phosphors dispersed in red phosphor layer 73, there were used phosphor particles made of Eu-activated $CaAlSiN_3$ and each provided with a coating made of a magnesium oxide. Their emission peak wavelengths were 660 nm, 540 nm, and 490 nm, respectively.

Red phosphor layer 73 was fabricated as follows. The red phosphors were uniformly mixed into a silicone resin raw material in a liquid state, and the raw material was then poured into base body 75 for resin curing. Next, as to green phosphor layer 72, the green phosphors were uniformly mixed into a silicone resin raw material in a liquid state, and the raw material was then poured onto red phosphor layer 73 for resin curing. Furthermore, as to blue phosphor layer 71, the blue phosphors were uniformly mixed into a raw material, and the raw material was then poured onto green phosphor layer 72 for resin curing. By doing so, there was formed a phosphor layer made of three layers (wavelength conversion member), which also served as a sealant of the light-emitting element. By forming the phosphor layers in this order, light emitted at red phosphor layer 73 was less likely to be absorbed by green phosphor layer 72 and blue phosphor layer 71 located thereabove. Furthermore, light emitted at green phosphor layer 72 was less likely to be absorbed by blue phosphor layer 71. It was therefore possible to efficiently emit visible light by reducing light absorption by each of the phosphor layers. In the case of the phosphors in the present example, less light is reflected at each of the surfaces of the phosphor particles, and as a result, reabsorption of fluorescence is increased. Accordingly, such phosphors received a greater advantage of reducing reabsorption by means of such an arrangement. With this, light of three primary colors could be emitted. In the case of oxynitride phosphor particles and nitride phosphor particles, each of the phosphors had an emission spectrum with a large half-width of not less than 50 nm, for example, so that favorable color rendering properties were obtained.

Example 4

Light-Emitting Device

Figure 6:
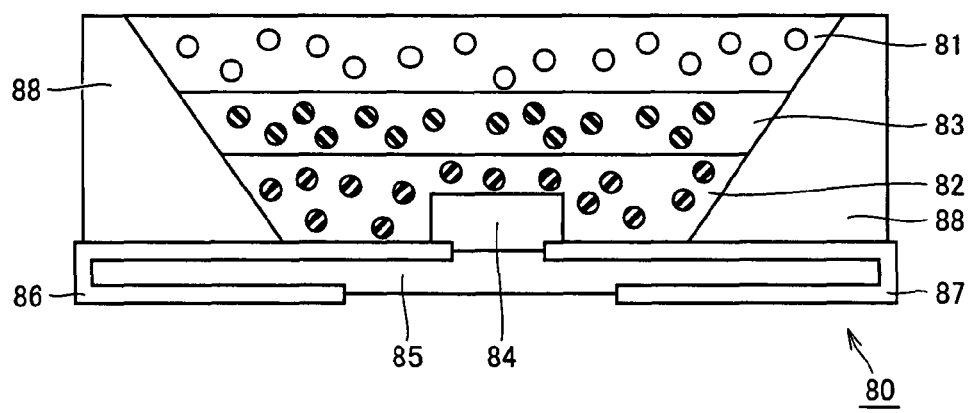
FIG. 6 is a cross-sectional view of a light-emitting device identified as still another example of the present invention.

In FIG. 6, light-emitting device 80 was fabricated of base body 85, electrodes 86, 87 formed at a surface of the base body, semiconductor light-emitting element 84 electrically connected to the electrodes, mirror 88, green phosphor layer 82, red phosphor layer 83, and blue phosphor layer 81. In the present example, a laminate made by stacking green phosphor layer 82, red phosphor layer 83, and blue phosphor layer 81 on base body 85 in this order was used as a wavelength conversion member. Red phosphor layer 83, green phosphor layer 82, and blue phosphor layer 81 were approximately similar to red phosphor layer 73, green phosphor layer 72, and blue phosphor layer 71 in Example 3, respectively. However, they were formed in an order different from that in Example 3. With this arrangement, blue phosphor layer 71, which had low luminosity factor and also had luminous efficacy somewhat lower than that of other colors, was also arranged at a position apart from semiconductor light-emitting element 84. It was thereby possible to suppress reabsorption of blue fluorescence at green phosphor layer 82 and red phosphor layer 83.

With this example, by allowing blue phosphor layer 81, which absorbs much excitation light, to be an uppermost layer, green light and red light could efficiently be extracted, so that it was possible to obtain a white light-emitting device excellent in wavelength conversion efficiency as a whole. With this, light of three primary colors could be emitted, and each of the phosphors had an emission spectrum with a large half-width of not less than 50 nm, for example, so that favorable color rendering properties were obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A wavelength conversion member comprising:
    phosphors made of (i) phosphor particles which are made of at least one of an oxynitride and a nitride and have a refractive index $n_1$, and (ii) a coating which coats each of said phosphor particles and has a refractive index $n_2$ said coating having multiple layers including an yttrium oxide, a magnesium oxide, an aluminum oxide, and a silicon oxide arranged on said phosphor particles in this order; and
    a medium having said phosphors dispersed therein and having a refractive index $n_3$,
    wherein the refractive index $n_2$ of the coating is a value between $n_3$ and $n_1$.

2. The wavelength conversion member according to claim 1, wherein the refractive index $n_2$ of said coating varies in a stepwise manner in a direction from a surface of each of the phosphor particles to an interface with the medium.

3. The wavelength conversion member according to claim 1, wherein said phosphor particles made of the oxynitride are phosphor particles each containing, as compositional elements, Si, Al, O, N, and at least one or two types of lanthanoid-based rare-earth elements.

4. The wavelength conversion member according to claim 1, wherein said phosphor particles made of the nitride are phosphor particles each containing, as compositional elements, Ca, Si, Al, N, and at least one or two types of lanthanoid-based rare-earth elements.

5. The wavelength conversion member according to claim 1, wherein the entire film thickness of said coating is not less than 5 nm and not more than 3 μm.

6. The wavelength conversion member according to claim 1, wherein said coating is formed by a sol-gel method.

7. The wavelength conversion member according to claim 1, wherein said medium is made of silicone resin.

8. The wavelength conversion member according to claim 1, wherein said medium is made of glass.

9. The wavelength conversion member according to claim 1, wherein said medium has
a first type of the phosphors having a fluorescence peak wavelength of not less than 400 nm and less than 500 nm,
a second type of the phosphors having a fluorescence peak wavelength of not less than 500 nm and less than 600 nm, and
a third type of the phosphors having a fluorescence peak wavelength of not less than 600 nm and not more than 700 nm dispersed therein.

10. The wavelength conversion member according to claim 1, comprising
a first wavelength conversion member layer in which said phosphors having a fluorescence peak wavelength of not less than 400 nm and less than 500 nm are dispersed in said medium,
a second wavelength conversion member layer in which said phosphors having a fluorescence peak wavelength of not less than 500 nm and less than 600 nm are dispersed in said medium, and
a third wavelength conversion member layer in which said phosphors having a fluorescence peak wavelength of not less than 600 nm and not more than 700 nm are dispersed in said medium.

11. A light-emitting device, comprising: a semiconductor light-emitting element; and the wavelength conversion member according to claim 1, arranged to allow light emitted by said semiconductor light-emitting element to be incident thereon.

12. The light-emitting device according to claim 11, wherein
a third wavelength conversion member layer in which said phosphors having a fluorescence peak wavelength of not less than 600 nm and not more than 700 nm are dispersed in said medium,
a second wavelength conversion member layer in which said phosphors having a fluorescence peak wavelength of not less than 500 nm and less than 600 nm are dispersed in said medium, and
a first wavelength conversion member layer in which said phosphors having a fluorescence peak wavelength of not less than 400 nm and less than 500 nm are dispersed in said medium
are arranged such that the light emitted by said semiconductor light-emitting element is made incident on the third, second, and first wavelength conversion member layers in this order.

13. The light-emitting device according to claim 11, wherein
a second wavelength conversion member layer in which said phosphors having a fluorescence peak wavelength of not less than 500 nm and less than 600 nm are dispersed in said medium,
a third wavelength conversion member layer in which said phosphors having a fluorescence peak wavelength of not less than 600 nm and not more than 700 nm are dispersed in said medium, and
a first wavelength conversion member layer in which said phosphors having a fluorescence peak wavelength of not less than 400 nm and less than 500 nm are dispersed in said medium
are arranged such that the light emitted by said semiconductor light-emitting element is made incident on the second, third, and first wavelength conversion member layers in this order.

14. The light-emitting device according to claim 11, wherein said semiconductor light-emitting element has an emission peak wavelength of not less than 370 nm and not more than 480 nm.

15. The light-emitting device according to claim 11, wherein said semiconductor light-emitting element is a semiconductor light-emitting element made of a GaN-based semiconductor.

16. The light-emitting device of claim 1, wherein said coating having multiple layers includes only the yttrium oxide, the magnesium oxide, the aluminum oxide, and the silicon oxide arranged on said phosphor particles in this order.

17. The light-emitting device of claim 1, wherein the yttrium oxide is provided directly on said phosphor particles.

* * * * *